(12) United States Patent
Ryu et al.

(10) Patent No.: US 11,467,625 B2
(45) Date of Patent: Oct. 11, 2022

(54) DISPLAY DEVICE

(71) Applicant: LG ELECTRONICS INC., Seoul (KR)

(72) Inventors: Jaeuk Ryu, Seoul (KR); Hyunsik Kim, Seoul (KR); Honghae Do, Seoul (KR); Hyunchul Moon, Seoul (KR); Chunsoo Chang, Seoul (KR); Jinhum Cho, Seoul (KR); Sangmoon Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 64 days.

(21) Appl. No.: 17/044,312

(22) PCT Filed: Jul. 26, 2018

(86) PCT No.: PCT/KR2018/008480
§ 371 (c)(1),
(2) Date: Sep. 30, 2020

(87) PCT Pub. No.: WO2020/022535
PCT Pub. Date: Jan. 30, 2020

(65) Prior Publication Data
US 2021/0116958 A1    Apr. 22, 2021

(30) Foreign Application Priority Data
Jul. 23, 2018  (KR) .................... 10-2018-0085365

(51) Int. Cl.
*G06F 1/16*     (2006.01)
*G02F 1/1333*   (2006.01)
(Continued)

(52) U.S. Cl.
CPC ...... *G06F 1/1601* (2013.01); *G02F 1/133308* (2013.01); *H01L 51/0097* (2013.01); *H01L 51/5246* (2013.01); *H05K 3/04* (2013.01)

(58) Field of Classification Search
CPC .................... G06F 1/1601; G02F 1/133308
See application file for complete search history.

(56) References Cited

U.S. PATENT DOCUMENTS 9,711,752 B2 *   7/2017  Lee .................... G09F 13/04
2010/0321870 A1* 12/2010  Hirai ................... G06F 1/1656
                                              361/679.01
(Continued)

FOREIGN PATENT DOCUMENTS

EP    2947708    11/2015
EP    3163362    5/2017
(Continued)

OTHER PUBLICATIONS

PCT International Application No. PCT/KR2018/008480, Notification of Transmittal of the International Search Report and the Written Opinion of the International Searching Authority, or Declaration dated Apr. 19, 2019, 12 pages.
(Continued)

*Primary Examiner* — Abhishek M Rathod
(74) *Attorney, Agent, or Firm* — Lee, Hong, Degerman, Kang & Waimey PC

(57) ABSTRACT

This display device comprises: a display panel; a module cover positioned on the rear surface of the display panel; an adhesive member coupling the module cover and the display panel; a substrate plate covering a first region on the rear surface of the module cover; and a control unit coupled to the rear surface of the substrate plate and controlling the display panel, wherein the substrate plate includes a contacting part that is in contact with the module cover, and a spacing part that is spaced apart from the module cover and
(Continued)

forms an air gap between the substrate plate and the module cover. The thickness of the module panel and the number of components can be reduced, such that the manufacturing cost of the display device and the weight of the product can be reduced.

8 Claims, 11 Drawing Sheets

(51) Int. Cl.
  *H01L 51/00* (2006.01)
  *H01L 51/52* (2006.01)
  *H05K 3/04* (2006.01)

(56) References Cited

U.S. PATENT DOCUMENTS

| | | | | |
|---|---|---|---|---|
| 2011/0310553 | A1* | 12/2011 | Hsiao | G06F 1/1616 361/679.55 |
| 2015/0340640 | A1* | 11/2015 | Kang | H01L 51/5246 257/40 |
| 2016/0219726 | A1* | 7/2016 | Saito | H05K 5/02 |
| 2016/0259207 | A1* | 9/2016 | Matsuo | G02F 1/133603 |
| 2017/0118859 | A1* | 4/2017 | Kang | H05K 7/1427 |
| 2017/0192293 | A1* | 7/2017 | Lee | G02F 1/133308 |
| 2017/0318694 | A1* | 11/2017 | Yun | H05K 5/0217 |
| 2018/0027671 | A1* | 1/2018 | Kang | G02F 1/133308 361/707 |

FOREIGN PATENT DOCUMENTS

| | | |
|---|---|---|
| EP | 3217654 | 9/2017 |
| KR | 1020150092066 | 8/2015 |
| KR | 1020150134511 | 12/2015 |
| KR | 1020170048807 | 5/2017 |
| KR | 101757723 | 8/2017 |
| KR | 1020180011447 | 2/2018 |

OTHER PUBLICATIONS

European Patent Office Application Serial No. 18927930.0, Search Report dated Nov. 22, 2021, 8 pages.

* cited by examiner (a)                                             (b)

| Bead | Reference | 1 mm Type A | 2 mm Type A | 3 mm Type A | 2 mm Type B |
|---|---|---|---|---|---|
| Gravity | 15.1 mm | 15.6 mm 33.8 % ▲ | 12.5 mm 17.2 % ▲ | 10.0 mm 33.8 % ▲ | 12.0 mm 20.5 % ▲ |
| Twist | 134.1 mm | 146.3 mm 9.1 % ▼ | 130.0 mm 3.1 % ▲ | 117.4 mm 12.5 % ▲ | 126.4 mm 5.7 % ▲ |
| 3 PB | 2.89 mm | 5.78 mm 100.0 % ▼ | 4.08 mm 41.2 % ▼ | 2.82 mm 2.4 % ▲ | 3.72 mm 28.7 % ▼ |

(c)

| Module Cover | Reference (w/o bead w bar) | 1.2T | 1.0T | 1.0T |
|---|---|---|---|---|
| Bead | | 3 mm (A type) | 5 mm (A type) | 5 mm (B type) |
| Gravity | 15.1 mm | 10 mm<br>33.8 % ▲ | 8.99 mm<br>40.4 % ▲ | 6.4 mm<br>57.4 % ▲ |
| Twist | 134.1 mm | 117.4 mm<br>12.5 % ▲ | 145.8 mm<br>8.72 % ▼ | 133.6 mm<br>0.4 % ▲ |
| 3 Point Bending | 2.89 mm | 2.82 mm<br>2.4% ▲ | 2.71 mm<br>6.3% ▲ | 2.55 mm<br>11.8% ▲ |

(c)

(a)

(b)

Max 43.7 / ΔT : 7.9

(a)

Max 43.9 / ΔT : 5.9

(b)

Max. 82.9 / AVG. 58.3

(c)

Max. 69.7 / AVG. 54.6

(d)

(a)

(b)

(a)

(b)

(c)

DISPLAY DEVICE

CROSS-REFERENCE TO RELATED APPLICATIONS

This application is the National Stage filing under 35 U.S.C. 371 of International Application No. PCT/KR2018/008480, filed on Jul. 26, 2018, which claims the benefit of earlier filing date and right of priority to Korean Application No. 10-2018-0085365, filed on Jul. 23, 2018, the contents of which are all hereby incorporated by reference herein in their entirety.

TECHNICAL FIELD

The present disclosure relates to a wireless communication system and, more particularly, to a display device for reducing the cost of manufacturing by improving the structure of a module cover disposed on the back of a display panel.

BACKGROUND ART

Display devices include a liquid crystal display (LCD) device, a field emission display (FED) device, a plasma display panel (PDP) device, an electroluminescence device, etc. An active matrix type of organic light emitting display device, one example of the electroluminescence device, has come into the market. Since the organic light emitting display device is capable of spontaneous light emission, the organic light emitting display device has advantages of no backlight unit, a fast response speed, and a large angle of field compared to the LCD device. Thus, the organic light emitting display device is under the spotlight as a next-generation display.

When the organic light emitting display is used as a display panel, the stiffness of a module cover supporting the organic light emitting display is significantly important since the organic light emitting display is made of a flexible material. In the related art, the module cover of the display device has a predetermined thickness. However, considering the recent trend that the module cover is made of only a metal plate to decrease the thickness of the display device, it may be difficult to obtain sufficient stiffness.

The conventional display device may include two module covers: a first module cover disposed on the rear surface of a display panel; and a second module cover disposed on the rear surface of the first module cover and forming the exterior of the display device in order to increase the stiffness of the display device. The first module cover may be made of a material with high heat conductivity to prevent head generated by a controller, which is disposed on the rear surface of the module cover, from being conducted to the display panel.

However, the use of the two module covers increase the manufacturing cost and the product weight. In particular, considering that the display device has increased in recent years, it is important to reduce the overall weight.

DISCLOSURE

Technical Problem

The object of the present disclosure is to reduce the manufacturing cost and weight of a display device by decreasing the number of components and, more particularly, by reducing the number of module covers disposed on a display panel from two to one.

Technical Solution

In one aspect of the present disclosure, a display device may include: a display panel; a module cover disposed on the rear surface of the display panel; an adhesive member coupling the display panel and the module cover; a substrate plate covering a first area on the rear surface of the module cover; and a controller disposed on the rear surface of the substrate plate and configured to control the display panel. The substrate plate may include: a contact portion in contact with the module cover; and a spaced portion spaced apart from the module cover and forming an air gap between the module cover and the substrate plate.

The display device may further include a bead formed in a second area of the module cover except the first area. The bead may be protruded toward the rear surface of the module cover.

The module cover may have the shape of a wide rectangle. The substrate plate may be disposed in a lower portion of the module cover. The bead may include a first bead having rectangular shape and formed in an upper portion of the substrate plate.

The display device may further include a second bead having rectangular shape and disposed inside the first bead.

The display device may further include a panel driver disposed on the rear surface of the display panel, wherein the panel driver may be connected to a lower portion of the display panel by a flexible substrate; and a third bead formed at a location corresponding to the panel driver.

The width and height of the third bead may depend on the size of the panel driver.

The display device may further include a fourth bead disposed on left and right sides of the substrate plate, and the substrate plate may be disposed above the third bead.

The height of the third bead may be smaller than those of the first and second beads.

The display device may further include a filler filled in a part of the bead from the front surface of the module cover The filler may include a double-sided tape corresponding to the height of the bead.

The display device may further include a fastening portion fastening the substrate plate and the module cover by applying pressure to at least part of the contact portion, and the contact portion may be disposed along an outer portion of the substrate plate.

The module cover may include: a metal plate; and a coating layer formed on the surface of the metal plate. The coating layer may be removed at a location corresponding to the fastening portion so that the metal plate is in contact with the substrate plate.

Advantageous Effects

According to at least one embodiment of the present disclosure, the thickness of a module panel and the number of components may be reduced, thereby reducing the manufacturing cost and product weight of a display device.

In addition, the stiffness of the display device may be maintained even when the module cover is simplified. Further, the heat generated by the display device may be efficiently radiated.

It will be appreciated by persons skilled in the art that the effects that could be achieved with the present disclosure are not limited to what has been particularly described herein-

BEST MODE

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
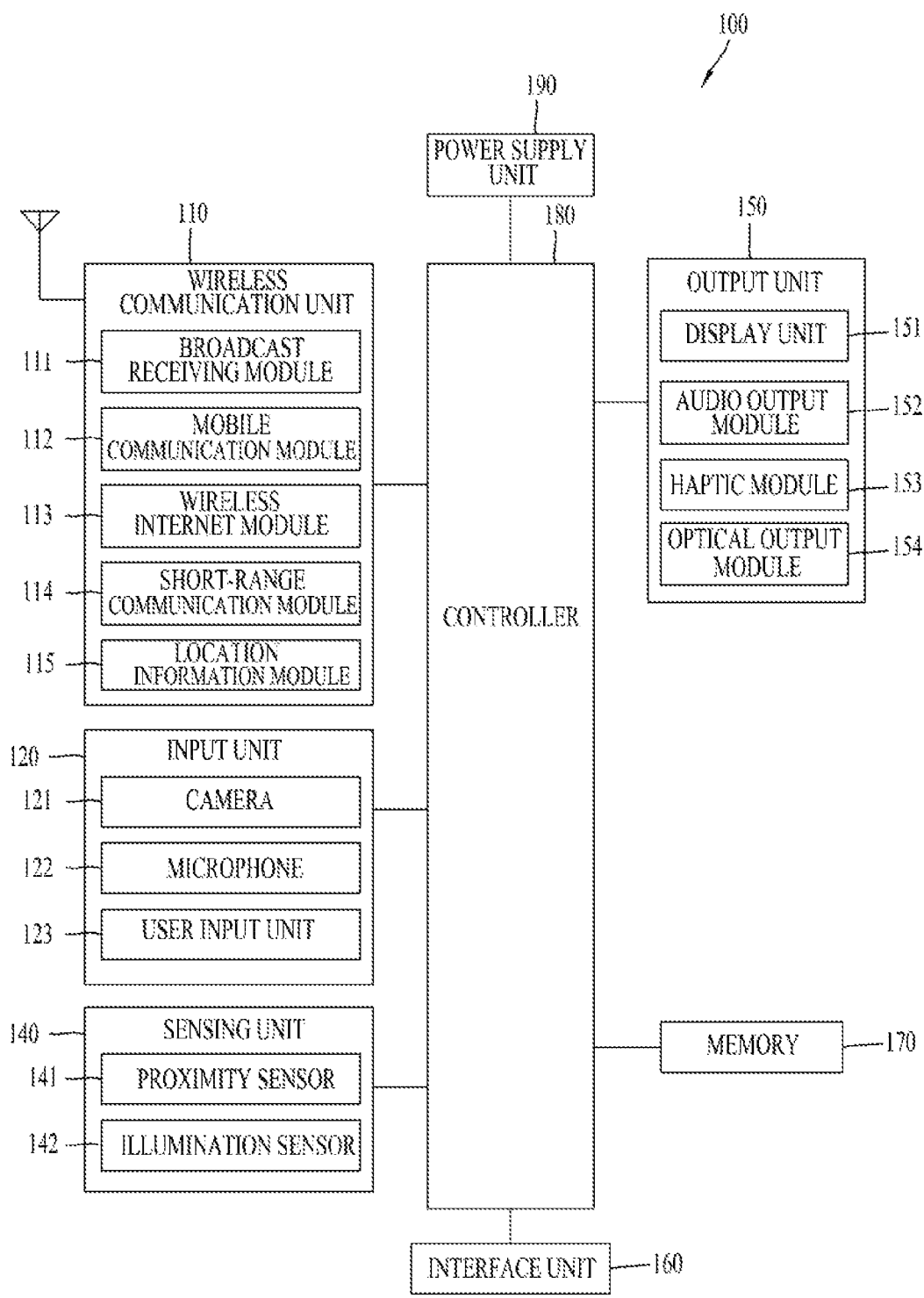
FIG. 1 is a block diagram of a display device in accordance with the present disclosure.

FIG. 1 is a block diagram of a display device 100 in accordance with the present disclosure.

The display device 100 is shown having components such as a wireless communication unit 110, an input unit 120, a sensing unit 140, an output unit 150, an interface unit 160, a memory 170, a controller 180, and a power supply unit 190. Referring now to FIG. 1A, the display device 100 is shown having wireless communication unit 110 configured with several commonly implemented components. It is understood that implementing all of the illustrated components is not a requirement, and that greater or fewer components may alternatively be implemented.

More specifically, the wireless communication unit 110 typically includes one or more modules which permit communications such as wireless communications between the display device 100 and a wireless communication system, communications between the display device 100 and another mobile terminal, communications between the display device 100 and an external server. Further, the wireless communication unit 110 typically includes one or more modules which connect the display device 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The display device 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the display device 100 and a user, as well as function as the user input unit 123 which provides an input interface between the display device 100 and the user.

The interface unit 160 serves as an interface with various types of external devices that can be coupled to the display device 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the display device 100 may perform assorted control functions associated with a connected external device, in response to the external device being connected to the interface unit 160.

The memory 170 is typically implemented to store data to support various functions or features of the display device 100. For instance, the memory 170 may be configured to store application programs executed in the display device 100, data or instructions for operations of the display device 100, and the like. Some of these application programs may be downloaded from an external server via wireless communication. Other application programs may be installed within the display device 100 at time of manufacturing or shipping, which is typically the case for basic functions of the display device 100 (for example, receiving a call, placing a call, receiving a message, sending a message, and the like). It is common for application programs to be stored in the memory 170, installed in the display device 100, and executed by the controller 180 to perform an operation (or function) for the display device 100.

The controller 180 typically functions to control overall operation of the display device 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the display device 100 to drive the application programs.

The power supply unit 190 can be configured to receive external power or provide internal power in order to supply appropriate power required for operating elements and components included in the display device 100. The power supply unit 190 may include a battery, and the battery may be configured to be embedded in the terminal body, or configured to be detachable from the terminal body.

Some or more of the components may be operated cooperatively to embody an operation, control or a control method of the display device in accordance with embodiments of the present disclosure. Also, the operation, control or control method of the display device may be realized on the display device by driving of one or more application problems stored in the memory 170.

Figure 2:
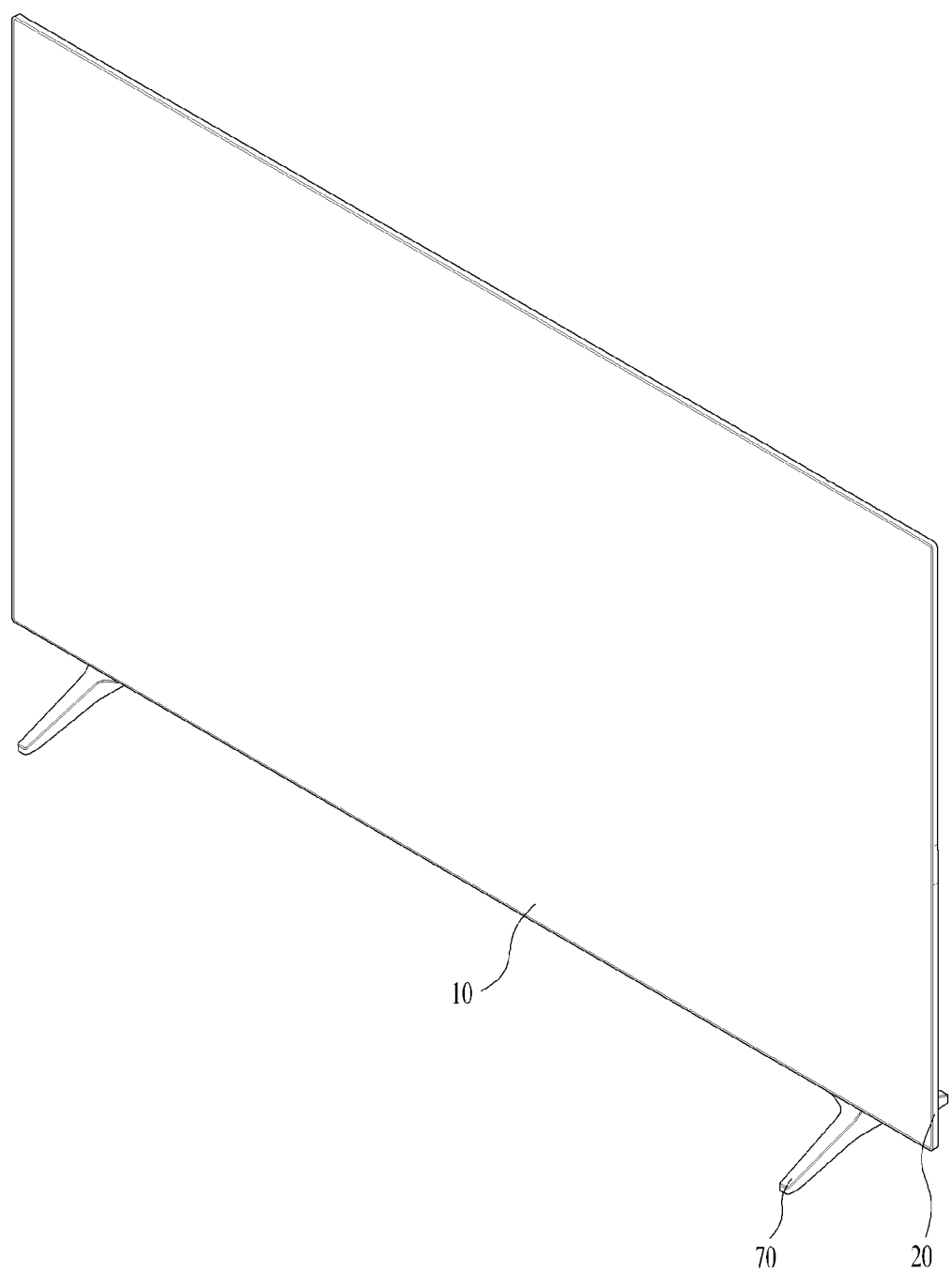
FIG. 2 is a front perspective view of one embodiment of the display device according to the present disclosure.

FIG. 2 is a front perspective view of one embodiment of the display device 100 according to the present disclosure. The display device 100 according to the present disclosure has the shape of a wide rectangle. That is, the horizontal side of the rectangle is longer than the vertical side of the rectangle. The display device 100 may include a stand. A wall-mounted display may include no stands.

A display panel 10 may include a transparent substrate, an upper electrode, an organic light emitting layer, and a lower electrode. The transparent substrate, the upper electrode, the organic light emitting layer, and the lower electrode may be arranged sequentially.

Each of the transparent substrate and upper electrode may include a transparent material (e.g., ITO). The lower electrode may include a non-transparent material. However, the present disclosure is not limited thereto, the lower electrode may also include a transparent material (e.g., ITO). In this case, light may be emitted from one surface of the lower electrode.

For example, the display device 100 may be an organic light emitting display panel device. An active matrix type of organic light emitting display panel includes an organic light emitting diode (OLED) and has advantages of a fast response speed, high light-emitting efficiency, high brightness, and a large angle of field.

The OLED, which is capable of spontaneous light emission, may include an anode electrode, a cathode electrode, and an organic compound layer formed between the two electrodes. The organic compound layer consists of a hole injection layer (HIL), a hole transport layer (HTL), an emission layer (EML), an electron transport layer (ETL), and an electron injection layer (EIL). When a driving voltage is applied to the anode and cathode electrodes, an electron passing through the ETL and a hole passing through the HTL move to the EML and form an exciton. Thereafter, the EML emits visible light.

Accordingly, since the OLED requires no auxiliary light source, the OLED may reduce the volume and weight of the display device 100. In addition, since the OLED has a response speed over 1000 times faster than that of a liquid display device, the OLED may have no image retention when displaying images.

In conventional display devices, a liquid crystal display (LCD) is typically used as the display panel. Since the LCD includes a backlight unit and an auxiliary member for supplying light such as a polarizing film, the conventional display device has a large thickness. In addition, since multiple layers are arranged, the conventional display device uses a case for pressing the front and rear surface thereof to fix the layers. The case covers the exterior of the display device, and more particularly, the front and side surfaces of the display device since the case needs to not only cover a bezel area in which a signal line is disposed except an image display area of the display panel but also prevent light emitted from the backlight unit from passing through the side surface.

However, the OLED panel has no light escaping caused by the backlight unit and thus requires no member for supporting the multilayer structure for the backlight unit and no polarizing film. Thus, the structure of the display panel may be simplified. In addition, since the bezel size of the OLED panel is much smaller than that of the LCD panel, the case structure may include only a module cover provided on the rear surface without a front case for covering the bezel.

Figure 3:
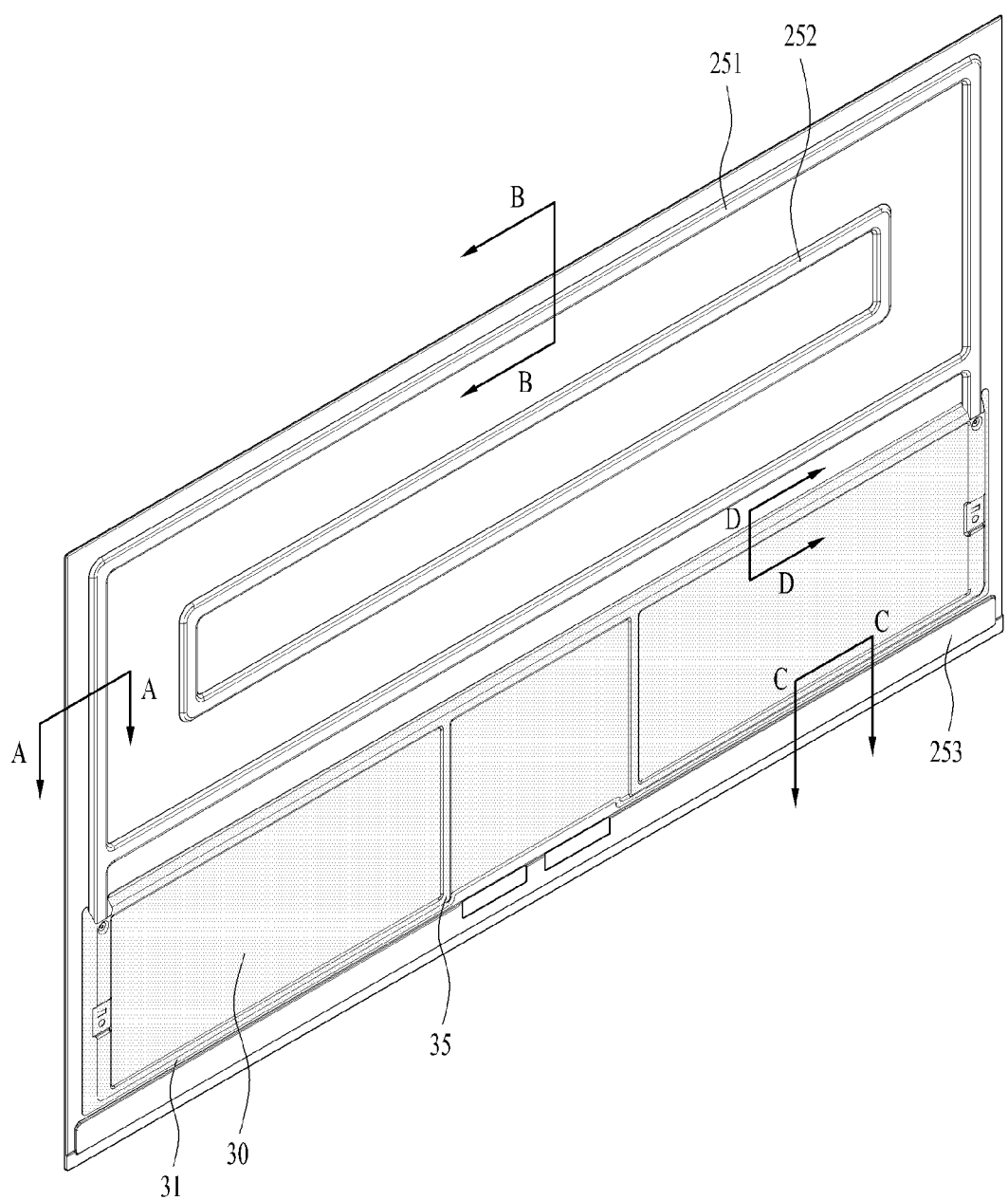
FIG. 3 is a perspective view of a rear surface of one embodiment of the display device according to the present disclosure without a rear cover.
Figure 4:
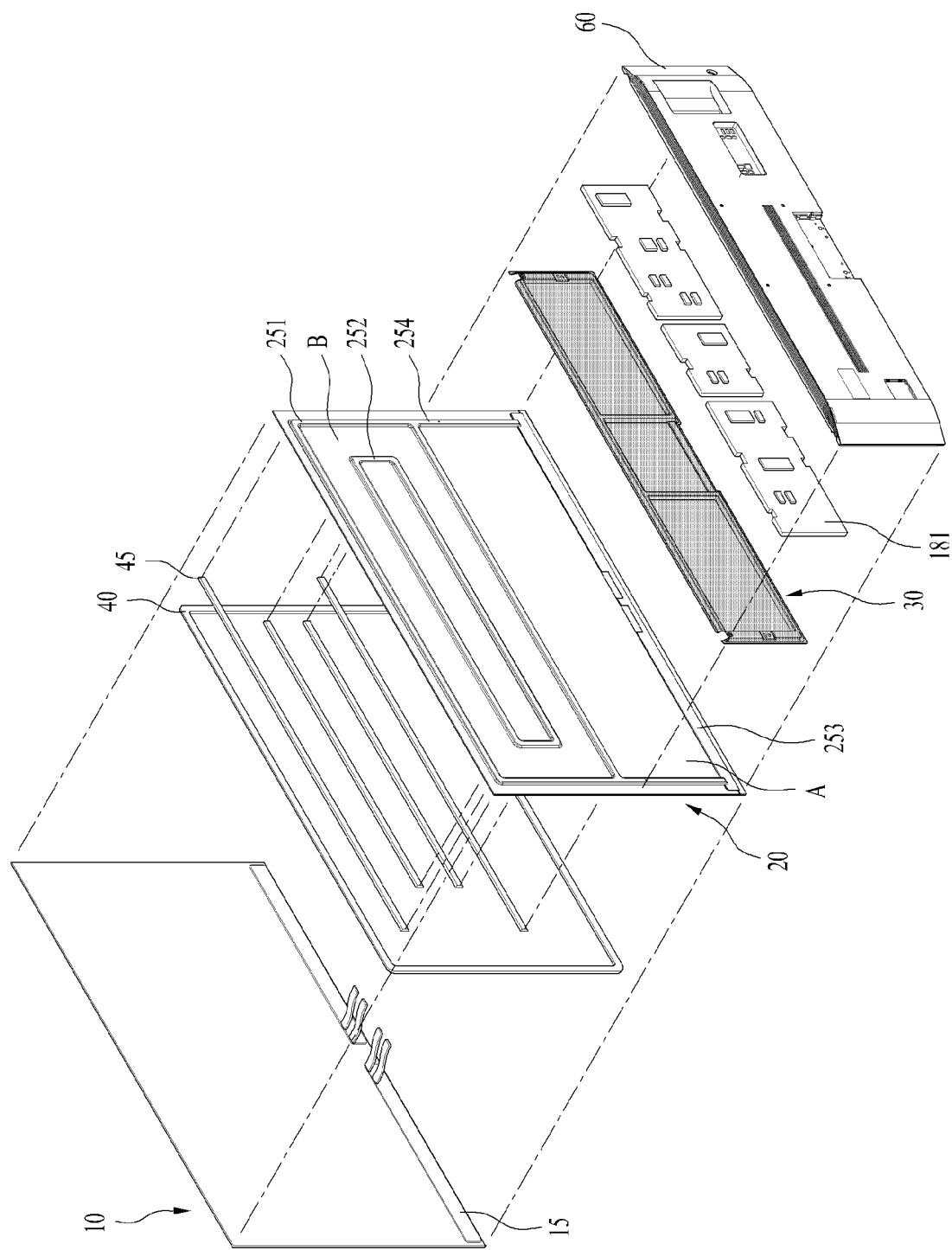
FIG. 4 is an exploded perspective view of one embodiment of the display device according to the present disclosure.

FIG. 3 is a rear view of one embodiment of the display device 100 according to the present disclosure without a rear cover, and FIG. 4 is an exploded perspective view of one embodiment of the display device 100 according to the present disclosure. The display device 100 may include a display panel 10, a module cover 20 provided on the rear surface of the display panel 10, a substrate plate 30 covering a first area A on the rear surface of the module cover 20 of the display panel 10, and a controller 180 disposed on the rear surface of the substrate plate 30 and configured to control the display panel 10. The controller 180 may include a printed circuit board 181 and a driver chip mounted thereon.

The module cover 20 may be disposed on the rear surface of the display panel 10 and coupled to the display panel 10 by an adhesive member 40. The adhesive member 40 may be, for example, a double-sided tape. Although FIG. 4 shows that the adhesive member 40 is disposed on the circumference, the adhesive member 40 may be additionally disposed for more stable coupling.

In the related art, an inner plate and a stiffness bar are provided within the module cover to enhance the stiffness of the display device. However, the module cover 20 may support the stiffness of the display device 100 according to the present disclosure with no inner plate and no stiffness bar. That is, the weight and thickness of the display device 100 may be reduced by decreasing the number of components such as the inner plate and stiffness bar.

However, when the inner plate and stiffness bar are not provided, the stiffness may decrease. Thus, a bead 25 may be formed in a second area B of the module cover 20 expect the first area A as shown in FIG. 4. The bead 25 refers to a protrusion protruded from one side to the other side obtained by pressing a metal plate with an embossing stamp.

When the embossing stamp is pressed onto one side of the metal plate, a corresponding point on the metal plate is protruded toward the other side, and the bead 25 is formed. Such a metal forming method is called beading. The bead 25 extended in one direction may resist bending in the extension direction of the bead 25, thereby enhancing the stiffness of the display device 100.

As shown in FIG. 3, the horizontal length of the display device is longer than the vertical length thereof, the display device 100 may be easily deformed in the horizontal direction. Thus, the length of the bead 25 extended in the horizontal direction may be longer than that of the bead 25 extended in the vertical direction. It may have a rectangular shape rather than a lattice shape in consideration of the design. When the height or width of the bead 25 increases, it may be helpful in enhancing the stiffness, but the thickness of the module cover 20 may increase. As the thickness of the module cover 20 increases, the beading becomes more difficult. That is, it is difficult to increase the size of the bead 25, and thus, determination of the minimum size of the bead 25 capable of satisfying stiffness standards is essential.

Figure 5:
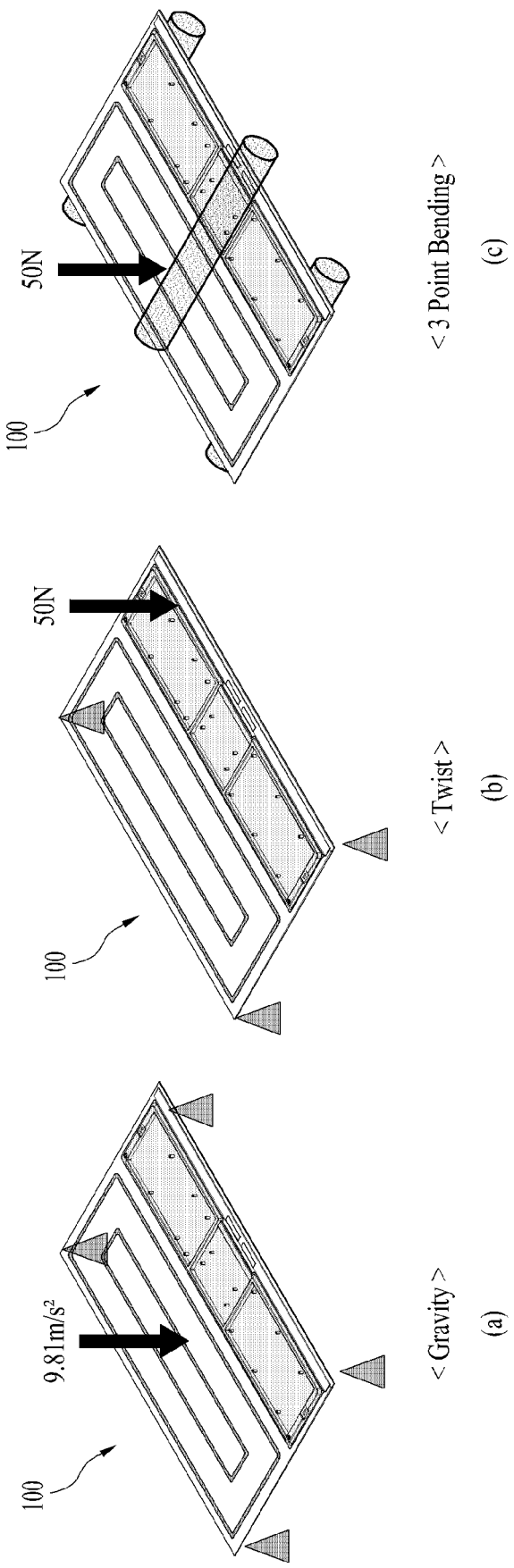
FIG. 5 is a view for explaining methods of testing the stiffness of the display device according to the present disclosure.

FIG. 5 is a view for explaining methods of testing the stiffness of the display device 100 according to the present disclosure. FIG. 5 (*a*) shows a method of measuring deflection by gravity. According to this method, the deflection by gravity is measured while the four corners are fixed. Specifically, the deflection is calculated by measuring a height difference between the center with the highest deflection and the corner.

FIG. 5 (*b*) shows a method of measuring deflection by twisting. According to this method, pressure is applied to one corner while the other three corners are fixed, and the deflection is calculated by measuring a height difference between the pressed corner and the fixed corner. FIG. 5 (*c*) shows a three-point bending (3PB) method. According to this method, deflection is measured by applying pressure to the center while the both ends in the length direction (horizontal direction) are fixed.

Referring to FIG. 3, since the substrate plate 30 is disposed in a lower portion of the display panel 10, a first bead 251 may be formed in the shape of a quadrangle along the outer line of the second area B in an upper portion of the display panel 10. To obtain additional stiffness, a second bead 252 may be formed in the shape of a rectangle inside the first bead 251.

Figure 6:
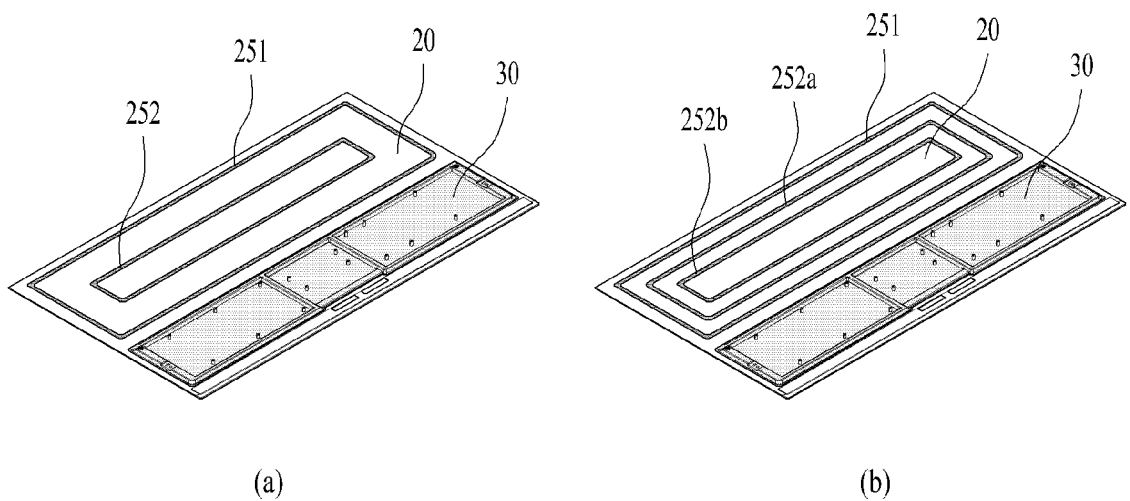
FIGS. 6 and 7 are views for explaining the performance of the display device according to the present disclosure depending on the shape of a bead.

FIG. 6 is a view for explaining the stiffness of the display device 100 according to the present disclosure depending on the shape of the bead 25. FIG. 6 (*a*) shows a case in which one second bead 252 is used, FIG. 6 (*b*) shows a case in which two second beads 252 are used, and FIG. 6 (*c*) shows deflection measured based on the three methods of FIG. 5 for two cases when the one second bead 252 is used (Type A) and when the two second beads 252 are used (Type B).

In the table of FIG. 6 (*c*), reference corresponds to the deflection of the display device 100 with the conventional inner plate and stiffness bar. The head 25 has a height of 1 to 3 mm. When the one second bead 252 is used, the deflection decreases and the stiffness increases as the height increases.

When the two second beads 252 are used and the height of the bead 25 is set to 2 mm, the stiffness increases compared to when one first bead 251 with a height of 2 mm is used. However, in this case, the deflection increase compared to when the height of the bead 25 is set to 3 mm.

Thus, increasing the height of the bead 25 from 2 mm to 3 mm shows better performance than increasing the number of second beads 252. Referring to the table of FIG. 6 (*c*), when the display device 100 uses the bead 25 with a height of 3 mm in Type A even without using the conventional inner plate and stiffness bar, the stiffness of the display device 100 may be improved compared to the conventional one.

Figure 7:
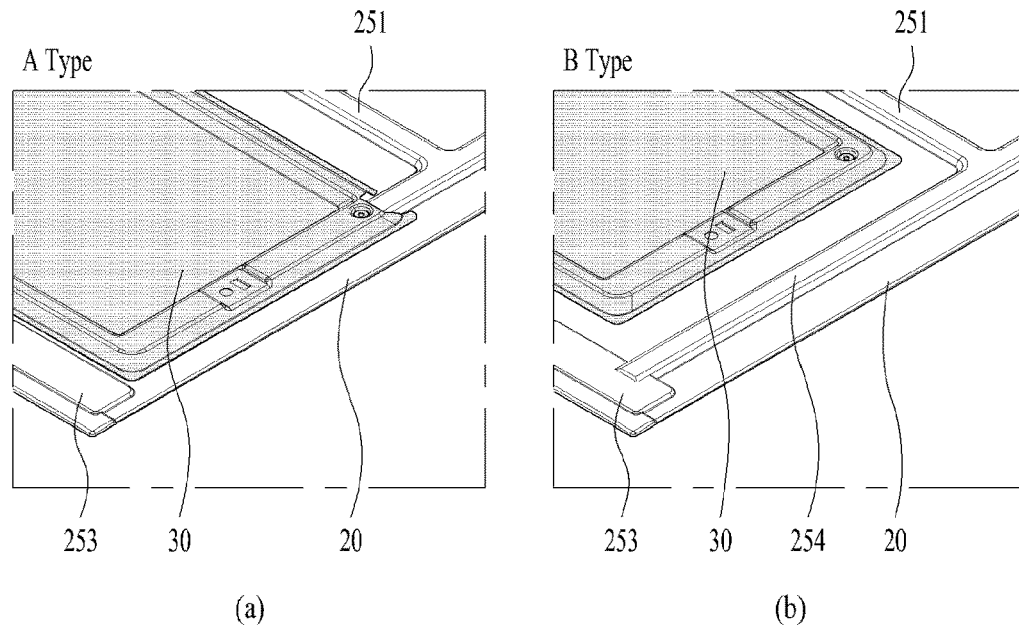

FIG. 7 is a view for explaining a third bead 253 and a fourth bead 254 of the display device 100 according to the present disclosure. When the bead 25 is formed in only the upper portion of the display panel 10, the stiffness of the lower portion of the display panel 10 may decrease. To avoid this problem, the third bead 253 extended in the horizontal direction may be formed in the lower portion. The third bead 253 may be formed at a location corresponding to that of a panel driver 15 disposed in the lower portion of the display panel 10.

The panel driver 15 is connected to the lower portion of the display panel 10 by a flexible substrate made of a flexible material. The flexible substrate is folded such that it is attached to the rear surface of the display panel 10. Since various integrated circuits (ICs) are mounted on the panel driver 15, heat is generated when the display panel 10 operates. Thus, the panel driver 15 needs to be located close to the module cover 20 to diffuse the heat generated by the panel driver 15 to the module cover 20.

As shown in FIGS. 7 (*a*) and (*b*), the height of the third bead 253 may be smaller than those of other beads. When the height of the bead 25 increases, the stiffness may be improved. However, in this case, the panel driver 15 may be spaced apart. Thus, the width and height of the third bead 253 may be determined in consideration of the width and thickness of the panel driver 15.

FIG. 7 (*b*) shows that the forth bead 254 is disposed at the left and right sides of the substrate plate 30 shown in FIG. 7 (*a*). FIG. 7 (*c*) shows the deflection of the display device 100 with the conventional inner plate and stiffness bar (reference), the deflection of the display device 100 when the thickness of the module cover 20 and the height of the bead 25 are respectively set to 1.2 T (1.2 mm) and 3 mm in the same structure as shown in FIG. 7 (*a*) (Type A), the deflection of the display device 100 when the thickness of the module cover 20 and the height of the bead 25 are respectively set to 1 T (1 mm) and 5 mm in the same structure as shown in FIG. 7 (*a*) (Type A), and the deflection of the display device 100 when the thickness of the module cover 20 and the height of the bead 25 are respectively set to 1 T (1 mm) and 5 mm in Type B.

In Type A, if the height of the bead 25 increases, the deflection by gravity or 3PB may be improved even though the thickness of the module cover 20 decreases. However, in this case, since the bead 25 is not present in the lower portion of the module cover 20, the deflection may increase compared to the conventional display device. When the thickness of the module cover 20 is 1.0 T, if the fourth bead 254 extended in the vertical direction is formed at the left and right sides of the substrate plate 30 to improve the deflection, the overall stiffness may be improved.

Figure 8:
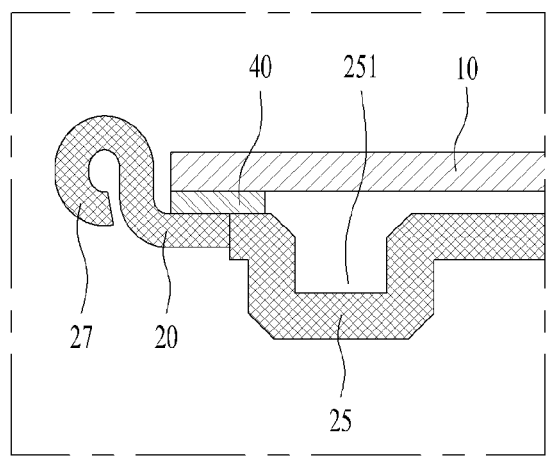
FIG. 8 is a view showing cross sections A-A and B-B of FIG. 3.
Figure 8:
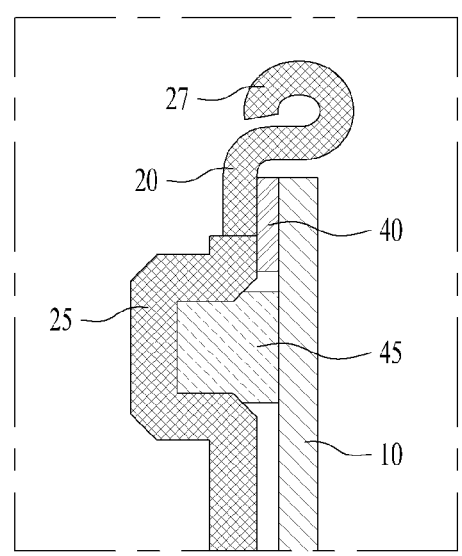

FIG. 8 is a view showing cross sections A-A and B-B of FIG. 3. Since the ends of a metal substrate, which is the raw material of the module cover 20, is sharp, the ends of the metal substrate may be processed such that the ends are not exposed to the outside to prevent users from being injured As described above, when the bead 25 is formed in the module cover 20, the bead 25 protruded toward the rear surface may generate a bead home 25' on the front surface. In this case, there may be an air pocket phenomenon where air stays in the display panel 10 and bead home 25'. In particular, while the display panel 10 operates, hot air may stay in the bead home 25'. This may prevent the heat generated by the display panel 10 from circulating, and as a result, the heat radiation performance may be degraded.

Figure 9:
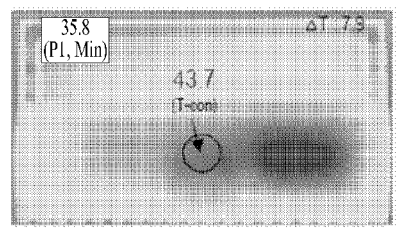
FIG. 9 is a view for explaining heat generation in the display device depending on the presence or absence of a filler.
Figure 9:
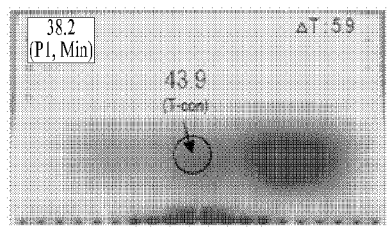
Figure 9:
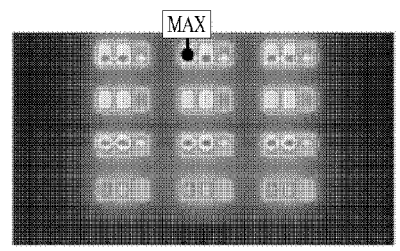
Figure 9:
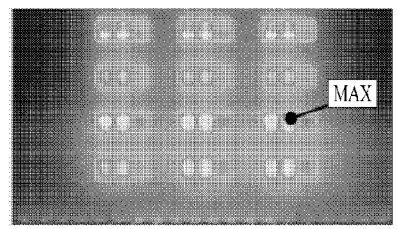

FIGS. 9 (*a*) and (*b*) show experimental data of heat generation in a screen when the air pocket phenomenon occurs in the bead 25, that is, when hot air stays in the bead 25. FIG. 9 (*a*) shows a measured saturation temperature when the white color is displayed on the full screen for a long time. The temperature of the lower portion in which the controller 180 is disposed is relatively higher than that of the upper portion. In this case, the heat generated in the low portion may not be diffused to the upper portion since hot air stays in the air pocket formed by the bead 25.

FIG. 9 (*b*) shows a measured saturation temperature when quadrangles with different brightness are displayed on the screen. The maximum temperature is about 82.9 degrees. The heat needs to be distributed to decrease that the maximum temperature. That is, uniform heat distribution with a small difference between the maximum and minimum temperatures is required. Considering that the air pocket prevents heat circulation, the bead home 25' may be filled with a filler as shown in FIG. 8 (*b*). Since the purpose of the filler 45 is to eliminate the air pocket, it may be made of a material with high thermal conductivity. If the filler 45 is made of an adhesive tape, it may also be act as an adhesive for coupling the display panel 10 and the module cover 20.

FIGS. 9 (*c*) and (*d*) show measured temperatures when the bead home 25' is filled with the filler 45. Referring to FIG. 9 (*c*) showing the temperature on the white screen, the temperature difference decreases from 7.9 degrees to 5.9 degrees. The maximum and average temperatures decrease when bright quadrangles are partially displayed as shown in FIG. 9 (*d*).

When the entirety of the bead home 25' formed by the bead 25 is filled with the filler 45, air may not be circulated due to the closed space. To avoid such a problem, the bead home 25' formed by the bead 25 in the horizontal direction may be filled with the filler 45 as shown in FIG. 8 (*b*), but some beads 25 may be left empty as shown in FIG. 8 (*a*).

Figure 10:
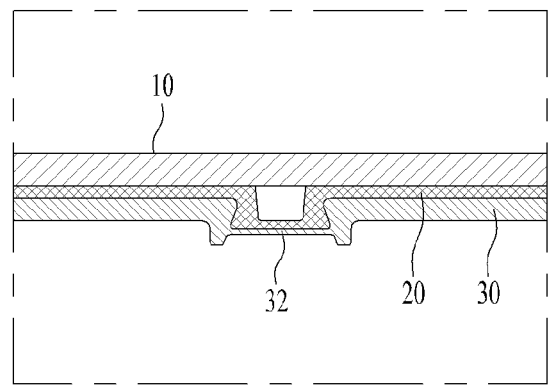
FIG. 10 is a view showing cross sections C-C and D-D of FIG. 3.
Figure 10:
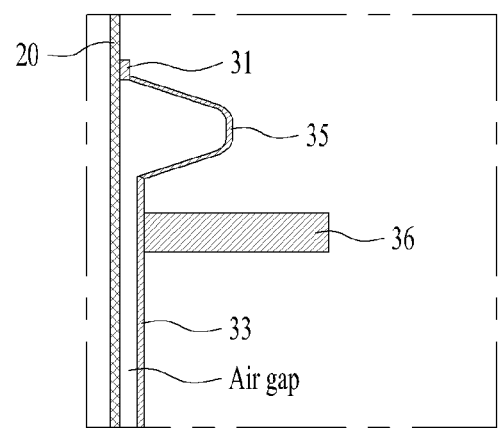

FIG. 10 is a view showing cross sections C-C and D-D according to the present disclosure. Specifically, FIG. 10 shows a coupling state between the module cover 20 and the substrate plate 30. The module cover 20 and substrate plate 30 may be partially coupled and spaced apart from each other by a predetermined distance to form an air gap. The air gap may prevent heat generated by the controller 180 mounted on the substrate plate 30 from being conducted to the display panel 10.

That is, the substrate plate 30 includes a spaced portion 33 spaced apart from a contact portion 31, which is in contact with the module cover 20, and the contact portion 31 may be disposed along the circumference of the substrate plate 30 as shown in FIG. 4. The contact portion 31 may be coupled by a fastener such as a screw, a rivet, etc. Alternatively, the contact portion 31 may be coupled by pressure applied between the module cover 20 and the substrate plate 30. A portion where the module cover 20 and the substrate plate 30 are further coupled to each other is referred to as a fastening portion 32, and the fastening portion 32 may be formed on a part of the contact portion 31.

Such pressing is advantageous in that no additional members such as a screw, a rivet, etc. are required. However, the contact portion 31 needs to have a conductive structure such a wide metal body to prevent the controller 180 from being damaged by static electricity. That is, the contact portion 31 may electrically connect the module cover 20 and the substrate plate 30 and absorb the static electricity applied to the controller 180 through the module cover 20 in order to protect the controller 180.

Figure 11:
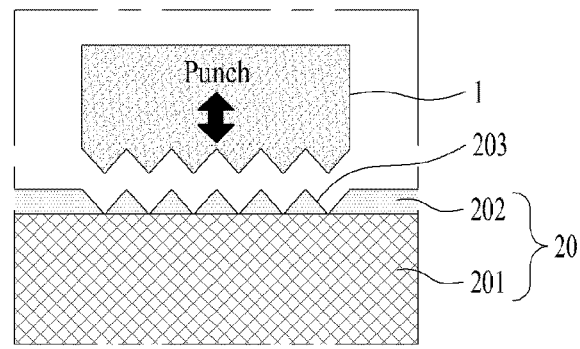
FIG. 11 is a view for explaining a fastening portion according to the present disclosure.
Figure 11:
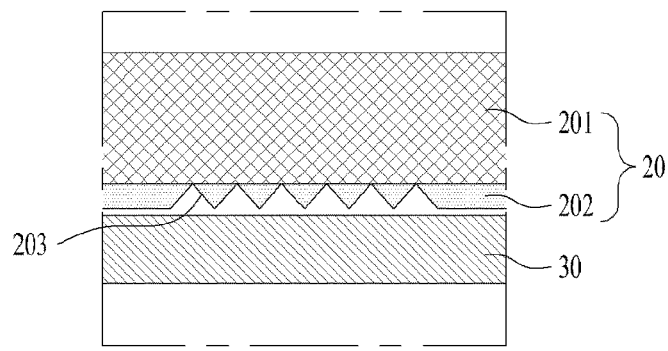
Figure 11:
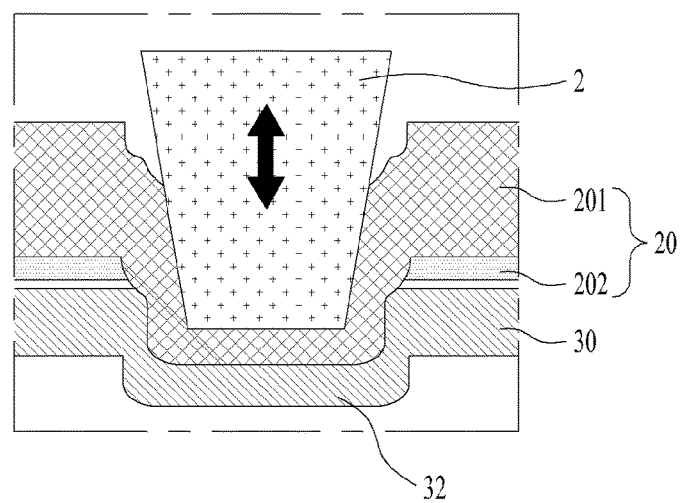

Since the module cover 20 is an external member, it may be implemented with a metal plate 201 having a coating layer 202 formed on one surface thereof. Since the metal plate 201 are not exposed outside by the coating layer 202, the coating may be removed from a position corresponding to the fastening portion 32 so that the metal plate 201 may be coupled to the substrate plate 30. Referring to FIG. 11, an embossing stamp may be pressed on the rear surface of the module cover 20 so that a part of the coating layer 202 may be removed as in a punch. Thereafter, by applying the pressure therebetween, the module cover 20 and the substrate plate 30 may be electrically connected to each other to prevent the static electricity.

Referring to FIG. 3, a back cover 60 coupled to the rear surface of the substrate plate 30 may be made of the same material as the module cover 20 or formed by an injection mold. As shown in FIG. 3, the back cover 60 may have ventilation holes, which are formed in upper and lower portions thereof, to release the heat generated by the controller 180. For coupling to the back cover 60, the substrate plate 30 may include a boss 36 (see FIG. 10 (*b*)) protruded toward the rear surface.

According to at least one of the embodiments, the thickness of the module cover 20 and the number of members may be reduced. Accordingly, the manufacture cost and weight of the display device 100 may be reduced.

In addition, even when the module cover is simplified, the stiffness of the display device 100 may be maintained. Further, the heat generated by the display device 100 may be effectively radiated.

The above-described embodiments are to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

The invention claimed is:

1. A display device comprising:
a display panel;
a panel driver disposed on a rear surface of the display panel, wherein the panel driver is connected to a lower portion of the display panel by a flexible substrate;
a module cover disposed on the rear surface of the display panel, wherein the module cover has a first area and a second area;
an adhesive member coupling the display panel and the module cover;
a bead formed in the second area of the module cover and protruded toward a rear surface of the module cover;
a substrate plate covering the first area on the rear surface of the module cover; and
a controller disposed on a rear surface of the substrate plate and configured to control the display panel,
wherein the substrate plate comprises:
a contact portion in contact with the module cover; and
a spaced portion spaced apart from the module cover and forming an air gap between the module cover and the substrate plate, and
wherein the bead comprises:
a first bead having rectangular shape and formed in an upper portion of the substrate plate;
a second bead having rectangular shape and disposed inside the first bead;
a third bead formed at a lower portion of the substrate plate and corresponding to the panel driver; and
a fourth bead disposed on left and right portions of the substrate plate, and connected to the first bead.

2. The display device of claim 1, wherein the module cover has a shape of a wide rectangle.

3. The display device of claim 1, wherein a width and height of the third bead depend on a size of the panel driver.

4. The display device of claim 1, wherein a height of the third bead is smaller than heights of the first and second beads.

5. The display device of claim 1, further comprising a filler filled in a part of the bead from a front surface of the module cover.

6. The display device of claim 5, wherein the filler comprises a double-sided tape corresponding to a height of the bead.

7. The display device of claim 1, further comprising a fastening portion fastening the substrate plate and the module cover by applying pressure to at least part of the contact portion, wherein the contact portion is disposed along an outer portion of the substrate plate.

8. The display device of claim 7, wherein the module cover comprises:
a metal plate; and
a coating layer formed on a surface of the metal plate, and
wherein the coating layer is removed at a location corresponding to the fastening portion so that the metal plate is in contact with the substrate plate.

* * * * *